(12) United States Patent
Nakayama (10) Patent No.: US 9,818,236 B2
(45) Date of Patent: Nov. 14, 2017

(54) PRODUCTION LINE MONITORING DEVICE (71) Applicant: FUJI MACHINE MFG. CO., LTD., Chiryu (JP)

(72) Inventor: Daisuke Nakayama, Toyokawa (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 353 days.

(21) Appl. No.: 14/425,424

(22) PCT Filed: Sep. 28, 2012

(86) PCT No.: PCT/JP2012/075239
§ 371 (c)(1),
(2) Date: Mar. 3, 2015

(87) PCT Pub. No.: WO2014/049872
PCT Pub. Date: Apr. 3, 2014

(65) Prior Publication Data
US 2015/0243108 A1  Aug. 27, 2015

(51) Int. Cl.
*G01N 37/00* (2006.01)
*G07C 3/14* (2006.01)
(Continued)

(52) U.S. Cl.
CPC ....... *G07C 3/146* (2013.01); *G05B 19/41875* (2013.01); *H05K 13/08* (2013.01); *G05B 2219/32222* (2013.01); *Y02P 90/22* (2015.11)

(58) Field of Classification Search
CPC .............. H05K 13/08; G05B 19/41875; G05B 2219/32222; G05B 2219/32221; G05B 2219/32214; G07C 3/146; Y02P 90/22
(Continued)

(56) References Cited

U.S. PATENT DOCUMENTS

2004/0030426 A1   2/2004 Popp et al.
2004/0199361 A1  10/2004 Lu et al.
(Continued)

FOREIGN PATENT DOCUMENTS

CN           1920868 A      2/2007
DE    10 2010 063 796 A1    6/2012
(Continued)

OTHER PUBLICATIONS

Combined Office Action and Search Report dated Jul. 13, 2016 in Chinese Patent Application No. 201280076090.1 (with English language translation and English translation of Categories of Cited Documents).

(Continued)

*Primary Examiner* — An Do
(74) *Attorney, Agent, or Firm* — Oblon, McClelland, Maier & Neustadt, L.L.P.

(57) ABSTRACT

A production line monitoring device that identifies a cause of a production defect, reduces the amount of analysis data and computation, and performs real-time processing, is provided. The production line monitoring device includes a defect indication detection unit that detects an indication of a production defect of a production line, and a defect cause identification unit that identifies a cause of the production defect. The defect indication detection unit collects measurement information measured by an inspection apparatus for each reference that identifies a position on products, and detects an indication of the production defect from the change with time of the measurement information at the references. The defect cause identification unit performs stratified analysis based on production information related to the reference when the defect indication detection unit detects an indication of a production defect, and identifies a cause of a production defect from a result of the analysis.

3 Claims, 5 Drawing Sheets (51) Int. Cl.
*H05K 13/08* (2006.01)
*G05B 19/418* (2006.01)

(58) Field of Classification Search
USPC .................................................. 702/81–84
See application file for complete search history.

(56) References Cited

U.S. PATENT DOCUMENTS

2010/0188417 A1    7/2010   Kojitani et al.
2012/0154149 A1    6/2012   Trumble

FOREIGN PATENT DOCUMENTS

| | | |
|---|---|---|
| EP | 2008-15663 A | 1/2008 |
| EP | 2 211 601 A2 | 7/2010 |
| JP | 3511632 | 3/2004 |
| JP | 3786137 B1 | 6/2006 |
| JP | 2010 177293 | 8/2010 |

OTHER PUBLICATIONS

International Search Report dated Oct. 23, 2012 in PCT/JP12/75239 Filed Sep. 28, 2012.
Chinese Office Action dated Dec. 29, 2016 in patent application No. 201280076090.1 with English translation.
Extended European Search Report dated Jun. 10, 2016 in Patent Application No. 12885868.5.
Chinese Office Action dated May 19, 2017 in Patent Application No. 201280076090.1 (with English translation).
European Office Action dated Apr. 20, 2017 in Patent Application No. 12 885 868.5.

| SUB-STRATE | REFERENCE | | |
|---|---|---|---|
| | REF1 | REF2 | REF3 |
| PB1 | SHIFT IN X-AXIS DIRECTION XS11, SHIFT IN Y-AXIS DIRECTION YS11, SHIFT IN θ DIRECTION θS11, | SHIFT IN X-AXIS DIRECTION XS12, SHIFT IN Y-AXIS DIRECTION YS12, SHIFT IN θ DIRECTION θS12, | SHIFT IN X-AXIS DIRECTION XS13, SHIFT IN Y-AXIS DIRECTION YS13, SHIFT IN θ DIRECTION θS13, |
| | COMPONENT MOUNTING MACHINE M1, COMPONENT MOUNTING HEAD H1, SUCTION NOZZLE N1, FEEDER F1, COMPONENT P1 | COMPONENT MOUNTING MACHINE M1, COMPONENT MOUNTING HEAD H1, SUCTION NOZZLE N2, FEEDER F2, COMPONENT P2 | COMPONENT MOUNTING MACHINE M2, COMPONENT MOUNTING HEAD H2, SUCTION NOZZLE N3, TRAY PT1, COMPONENT P3 |
| PB2 | SHIFT IN X-AXIS DIRECTION XS21, SHIFT IN Y-AXIS DIRECTION YS21, SHIFT IN θ DIRECTION θS21, | SHIFT IN X-AXIS DIRECTION XS22, SHIFT IN Y-AXIS DIRECTION YS22, SHIFT IN θ DIRECTION θS22, | SHIFT IN X-AXIS DIRECTION XS23, SHIFT IN Y-AXIS DIRECTION YS23, SHIFT IN θ DIRECTION θS23, |
| | COMPONENT MOUNTING MACHINE M3, COMPONENT MOUNTING HEAD H3, SUCTION NOZZLE N4, FEEDER F3, COMPONENT P1 | COMPONENT MOUNTING MACHINE M3, COMPONENT MOUNTING HEAD H3, SUCTION NOZZLE N5, FEEDER F4, COMPONENT P2 | COMPONENT MOUNTING MACHINE M4, COMPONENT MOUNTING HEAD H4, SUCTION NOZZLE N6, TRAY PT1, COMPONENT P3 |
| PB3 | SHIFT IN X-AXIS DIRECTION XS31, SHIFT IN Y-AXIS DIRECTION YS31, SHIFT IN θ DIRECTION θS31, | SHIFT IN X-AXIS DIRECTION XS32, SHIFT IN Y-AXIS DIRECTION YS32, SHIFT IN θ DIRECTION θS32, | SHIFT IN X-AXIS DIRECTION XS33, SHIFT IN Y-AXIS DIRECTION YS33, SHIFT IN θ DIRECTION θS33, |
| | COMPONENT MOUNTING MACHINE M1, COMPONENT MOUNTING HEAD H1, SUCTION NOZZLE N1, FEEDER F1, COMPONENT P1 | COMPONENT MOUNTING MACHINE M1, COMPONENT MOUNTING HEAD H1, SUCTION NOZZLE N2, FEEDER F2, COMPONENT P2 | COMPONENT MOUNTING MACHINE M2, COMPONENT MOUNTING HEAD H2, SUCTION NOZZLE N3, TRAY PT1, COMPONENT P3 |

SHIFT IN X-AXIS DIRECTION (XH1)

(b)

SHIFT IN X-AXIS DIRECTION (XN2)

(c)

SHIFT IN X-AXIS DIRECTION (XF2)

PRODUCTION LINE MONITORING DEVICE

TECHNICAL FIELD

The present disclosure relates to a production line monitoring device that identifies a cause of a production defect by detecting an indication of a production defect of a production line.

BACKGROUND ART

Examples of a production line monitoring device include an invention disclosed in PTL 1. In the invention disclosed in PTL 1, an inspection result of each of a printing process, a mounting process, and a soldering process is compared between printed circuit boards. Further, the influence of each process on a final defect is calculated and a cause of a defect is analyzed.

CITATION LIST

Patent Literature

PTL 1: Japanese Patent No. 3511632

SUMMARY

Technical Problem

However, in the invention disclosed in the PTL 1, the probability of occurrence of a cause of a defect is calculated in advance and a cause of a defect is analyzed on the basis of the calculated probability of occurrence. For this reason, the analyzed result does not necessarily mean an actual cause of a defect. Further, when all of various kinds of measurement information, which are acquired by an inspection apparatus, are analyzed over time, the amount of data and the amount of computation are large. As a result, since it is difficult to end the analysis until the completion of a production process, it is difficult to perform the analysis of the measurement information in real time.

The disclosure has been made in consideration of these circumstances, and an object of the disclosure is to provide a production line monitoring device that can identify a cause of a production defect with a high accuracy, reduce the amount of analysis data and the amount of computation, and perform real-time processing.

Solution to Problem

One embodiment of a production line monitoring device includes a defect indication detection unit that detects an indication of a production defect of a production line, and a defect cause identification unit that identifies a cause of the production defect. The defect indication detection unit collects measurement information that is measured by an inspection apparatus for each reference that identifies a position on products, and detects an indication of the production defect from the change with time of the measurement information at the references. The defect cause identification unit performs stratified analysis on the basis of production information that is related to the reference when the defect indication detection unit detects an indication of the production defect, and identifies a cause of the production defect from a result of the analysis.

In another embodiment of the production line monitoring device, the production information is at least one of information about facilities of the production line, information about a raw material to be supplied to the production line, information about an operator operating the production line, and information about a producing procedure of the production line.

In another embodiment of the production line monitoring device, the defect indication detection unit detects an indication of the production defect on the basis of a process capability index or an incidence of the production defect that is calculated from the measurement information.

In another embodiment of the production line monitoring device, the production line is a substrate production line including a solder printer that performs printing on a substrate with solder paste, a component mounting machine that mounts a component on the substrate, and a reflow machine that solders the component mounted on the substrate; and the inspection apparatus is provided in the substrate production line.

Advantageous Effects

According to one embodiment of the production line monitoring device, the defect indication detection unit collects measurement information that is measured by an inspection apparatus for each reference that identifies a position on products, and detects an indication of the production defect from the change with time of the measurement information at the references. For this reason, since it is easy to identify the reference related to the production defect, it is easy to extract measurement information at the identified reference and production information that is related to the identified reference.

Further, the defect cause identification unit performs stratified analysis on the basis of production information that is related to the reference when the defect indication detection unit detects an indication of the production defect, and identifies a cause of the production defect from a result of the analysis. For this reason, the defect cause identification unit can identify a cause of a production defect with a high accuracy in comparison with a case in which the defect cause identification unit analyzes a cause of a defect on the basis of the probability of occurrence calculated in advance or designates and limits an object to be analyzed in advance.

The production information generally includes plural pieces of information for a plurality of items (kinds). Meanwhile, production information related to one reference is limited to one piece of information for one item (kind). For this reason, the defect cause identification unit can limit an object, which is to be analyzed, to one piece of production information for each item (kind) of the production information related to the reference when an indication of the production defect is detected. Accordingly, since the production line monitoring device can reduce the amount of analysis data and the amount of computation in comparison with a case in which analysis is performed for all production information, the production line monitoring device easily performs real-time processing.

According to another embodiment of the production line monitoring device, the production information is at least one of information about facilities of the production line, information about a raw material to be supplied to the production line, information about an operator operating the production line, and information about a producing procedure of the production line. For this reason, it is possible to easily understand a cause of a production defect that may be generated in the production line, and to extract a cause of the defect of the production line without omission.

According to another embodiment of the production line monitoring device, the defect indication detection unit detects an indication of the production defect on the basis of a process capability index or an incidence of the production defect that is calculated from the measurement information. For this reason, since it is easy to quantify production quality, the defect indication detection unit can easily determine whether or not production quality is in the standard range. Further, the defect indication detection unit can quantitatively detect an indication of a production defect.

According to another embodiment of the production line monitoring device 4, the inspection apparatus is provided in a substrate production line that includes a solder printer, a component mounting machine, and a reflow machine. When the inspection apparatus is provided between the solder printer and the component mounting machine, the inspection apparatus can inspect the state of a solder on which the components are not yet mounted. Further, when the inspection apparatus is provided between the component mounting machine and the reflow machine, the inspection apparatus can inspect the mounting states of the components. In particular, since the inspection apparatus can detect positional shifts and rotational shifts of the components to be mounted on the substrates, it is possible to improve the mounting accuracy of the components. Furthermore, when the inspection apparatus is provided at the rear portion of the reflow machine, the inspection apparatus can inspect the quality of finished substrates such as the soldering states of the substrates.

DESCRIPTION OF EMBODIMENTS

An embodiment of the disclosure will be described below with reference to the drawings. Each of the drawings is a conceptual diagram and does not define the dimensions of detailed structures.

<Production line>

In this embodiment, a substrate production line 1, which produces a substrate on which a lot of components are mounted, will be described as an example of a production line. Meanwhile, the substrate production line 1, which mounts three components P1 to P3 on three substrates PB1 to PB3, respectively, will be described for convenience of description, but the number of substrates and the number of components are not limited thereto. Further, a production line is not limited to the substrate production line 1, and the disclosure can be applied to various production lines, such as a production line for a machine tool and a production line for an automobile.

Figure 1:
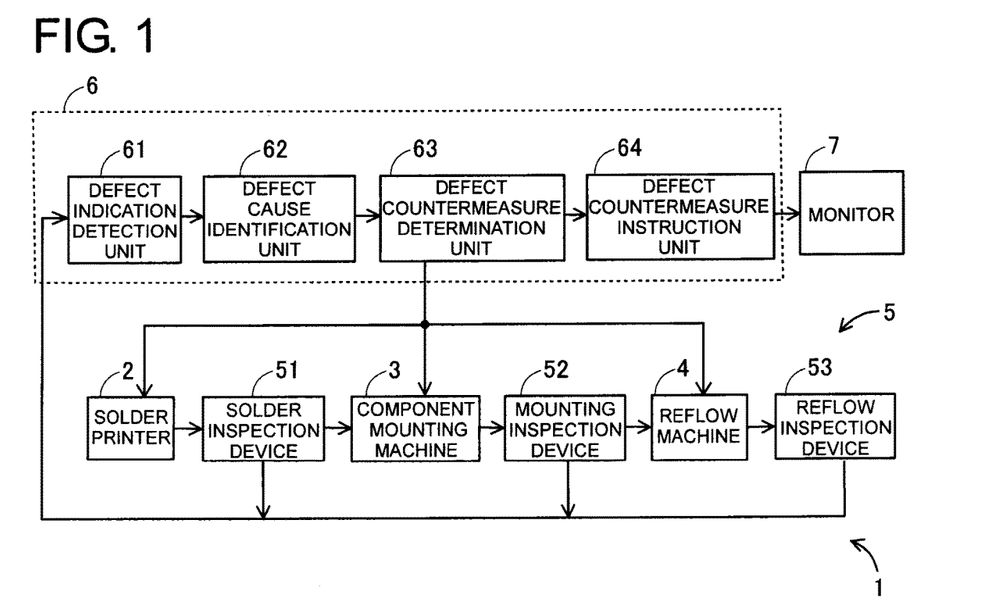
FIG. 1 is a block diagram showing an example of a control block of a production line monitoring device.

FIG. 1 is a block diagram showing an example of a control block of a production line monitoring device 6. The substrate production line 1 includes a solder printer 2 that performs printing on the substrates PB1 to PB3 with solder paste, a component mounting machine 3 that mounts the components P1 to P3 on the substrates PB1 to PB3, and a reflow machine 4 that solders the components P1 to P3 mounted on the substrates PB1 to P33. The substrate production line 1 is provided with a substrate conveying device (for example, a belt conveyor or the like). The substrates PB1 to PB3 are conveyed into the solder printer 2 by the substrate conveying device, and are conveyed to the component mounting machine 3 and the reflow machine 4 in this order. Finished substrates are conveyed from the reflow machine 4.

The solder printer 2 is a well-known solder printer, and performs printing with solder paste at joints between the substrate PB1 and the components P1 to P3. The solder paste is paste in which flux is added to powdery solder so that viscosity is appropriately adjusted. The same also applies to the substrates PB2 and PB3.

The component mounting machine 3 is a well-known component mounting machine, and sucks and picks up the components P1 to P3 and mounts the components P1 to P3 on the substrate PB1 that is conveyed to a mounting position. The same also applies to the substrates PB2 and PB3. The component mounting machine 3 can be formed of one component mounting machine 3. Further, a plurality of modularized component mounting machines 3 can be arranged in a line to form a component mounting line.

The reflow machine 4 is a well-known reflow machine, and solders the components P1 to P3 and the substrate PB1 by heating the substrate PB1 on which the components P1 to P3 have been mounted. The same also applies to the substrates PB2 and PB3.

An inspection apparatus 5 is a well-known substrate inspection apparatus, and inspects the state of a substrate that is being produced and the quality of a finished substrate. The inspection apparatus 5 includes a solder inspection device 51, a mounting inspection device 52, and a reflow inspection device 53. The solder inspection device 51 is provided between the solder printer 2 and the component mounting machine 3, and inspects the position of printed solder, the height of the solder, the area of the solder, the volume of the solder, whether or not a solder bridge is present, and the like. That is, the solder inspection device 51 can inspect the state of a solder on which the components are not yet mounted.

The mounting inspection device 52 is provided between the component mounting machine 3 and the reflow machine 4, and inspects the mounting states of the components P1 to P3, such as whether or not the components P1 to P3 are present, whether or not the components P1 to P3 are proper, the positions of the mounted components, the abnormalities of the polarities of the mounted components P1 to P3, and whether or not a foreign material is present. In particular, since the mounting inspection device 52 can detect positional shifts and rotational shifts of the components P1 to P3 to be mounted on the substrates PB1 to PB3, it is possible to improve the mounting accuracy of the components P1 to P3. The reflow inspection device 53 is provided at the rear portion of the reflow machine 4, and inspects the quality of finished substrates such as the soldering states of the substrates PB1 to PB3. In this specification, various inspection results measured by the inspection apparatus 5 are referred to as measurement information.

<Production Line Monitoring Device>

The production line monitoring device 6 is provided in a host computer, and identifies a cause of a production defect by detecting an indication of a production defect of the substrate production line 1. The host computer includes a CPU and a memory, and can drive the production line monitoring device 6 by executing a program stored in the memory. When the production line monitoring device 6 is taken as a control block as shown in FIG. 1, the production line monitoring device 6 includes a defect indication detection unit 61, a defect cause identification unit 62, a defect countermeasure determination unit 63, and a defect countermeasure instruction unit 64.

(Defect Indication Detection Unit 61)

Figure 2:
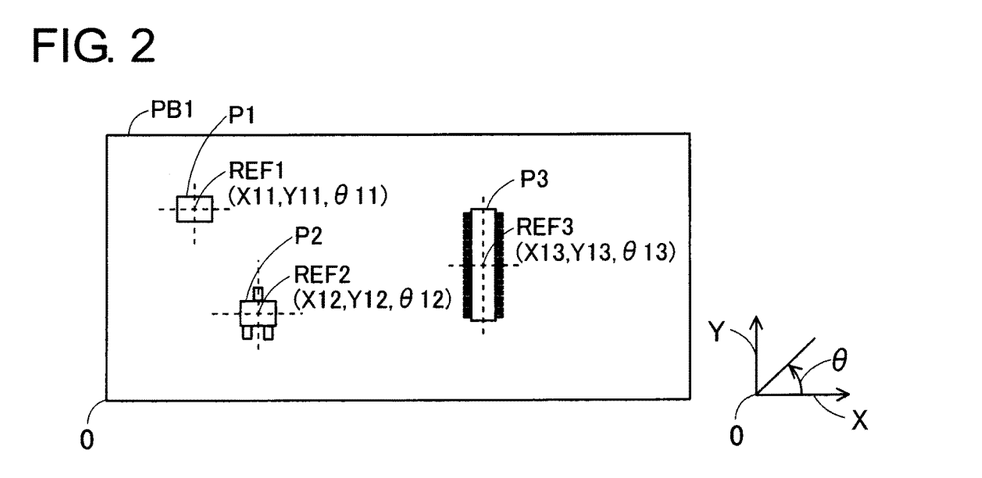
FIG. 2 is a view showing references on a substrate.

The defect indication detection unit 61 detects an indication of a production defect of the substrate production line 1. First, the defect indication detection unit 61 collects measurement information for each of the references REF1 to REF3 that identify mounting positions on the substrate PB1. The same also applies to the substrates PB2 and PB3. FIG. 2 is a view showing references REF1 to REF3 on the substrate PB1. In FIG. 2, a corner of the substrate PB1, which is positioned on the lower left side in the plane of paper, is referred to as an origin 0. Further, a rightward direction in the plane of the paper is referred to as an X-axis direction, and an upward direction in the plane of the paper is referred to as a Y-axis direction. Furthermore, a rotation angle from an X axis about the origin 0 is denoted by $\theta$.

A mounting position on the substrate PB1 on which the component P1 is to be mounted is represented by the reference REF1. Specifically, the mounting position of the component P1 is represented by an X-axis direction position X11, a Y-axis direction position Y11, and a $\theta$-direction rotation angle $\theta$11. That is, the reference REF1 identifies the mounting position of the component P1 on the substrate PB1. The same also applies to the components P2 and P3, and the mounting positions of the components P2 and P3 on the substrate PB1 are identified by the references REF2 and REF3. Meanwhile, the same also applies to the substrates PB2 and PB3.

Figure 3:
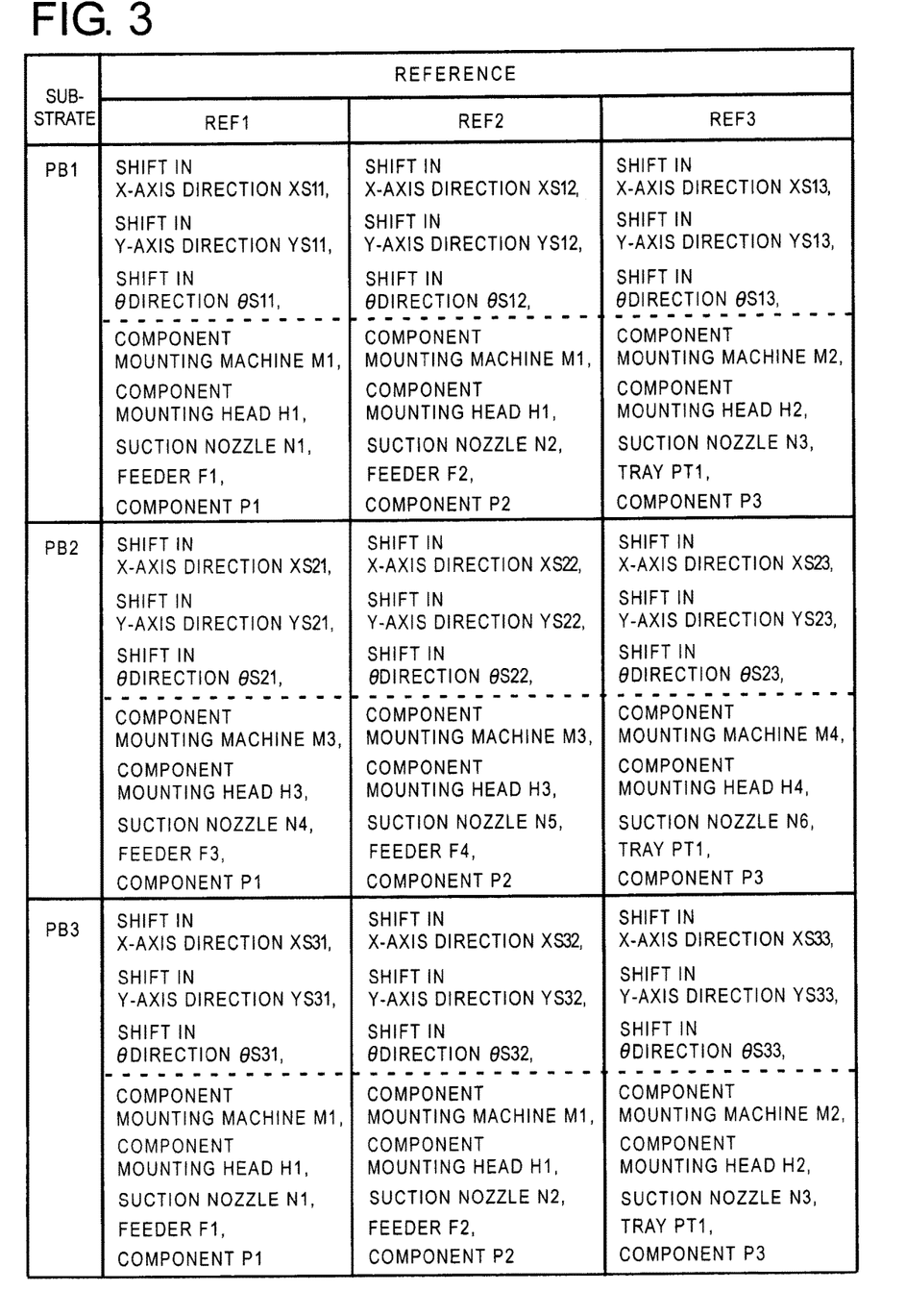
FIG. 3 is a view showing examples of measurement information and production information.

Measurement information measured by the inspection apparatus 5 is sent to the defect indication detection unit 61 in a predetermined period. FIG. 3 is a view showing examples of measurement information and production information. FIG. 3 shows an example of measurement information, which is obtained when the components P1 to P3 are mounted on the three substrates PB1 to PB3, respectively, and shows the inspection results (measurement information) of the mounting inspection device 52. For example, a shift XS11 of the component P1 on the substrate PB1 in the X-axis direction means a shift of the component P1 in the X-axis direction relative to a regular X-axis direction position X11 of the component P1. The same also applies to a shift YS11 of the component P1 in the Y-axis direction and a shift $\theta$S11 of the component P1 in a $\theta$ direction. Further, the same also applies to the components P2 and P3 and the substrates PB2 and PB3, and the same also applies to the other inspection devices and the other inspection results (measurement information).

In FIG. 3, an example of production information related to the references REF1 to REF3 is shown in conjunction with the measurement information of the inspection apparatus 5. It is suitable that the production information is at least one of facility information of the substrate production line 1, information about a raw material to be supplied to the substrate production line 1, information about an operator operating the substrate production line 1, and information about a producing procedure of the substrate production line 1.

The facility information of the substrate production line 1 is information about production facilities of the substrate production line 1. For example, in the component mounting machine 3, the facility information of the substrate production line 1 includes component mounting machine numbers M1 to M4 that identify the component mounting machines 3, component mounting head numbers H1 to H4 that identify component mounting heads mounting the components P1 to P3, suction nozzle numbers N1 to N6 that identify suction nozzles for sucking the components P1 to P3, feeder numbers F1 to F4 that identify feeders for feeding the components P1 and P2, and a tray number PT1 that identifies a tray unit for supplying the component P3.

Examples of the information about a raw material to be supplied to the substrate production line 1 include component numbers that identify the components P1 to P3, component lot numbers that identify production lots of the components P1 to P3, and component manufacturer numbers that identify component manufacturers. Further, examples of the information about an operator operating the substrate production line 1 include the name, age, and affiliation of the operator. Examples of the information about a producing procedure of the substrate production line 1 include a mounting order of the components P1 to P3, and condition setting at the time of the mounting of the components, such as a pressure condition of a positive pressure or negative pressure.

In FIG. 3, for example, a component mounting machine number (component mounting machine M1), a component mounting head number (component mounting head H1), a suction nozzle number (suction nozzle N1), a feeder number (feeder F1), and a component number (component P1) are written as production information at the reference REF1 of the substrate PB1. The same also applies to the references REF2 and REF3, and the same also applies to the substrates PB2 and PB3.

In this embodiment, the production information is at least one of the facility information of the substrate production line 1, the information about a raw material to be supplied to the substrate production line 1, the information about an operator operating the substrate production line 1, and the information about a producing procedure of the substrate production line 1. For this reason, it is possible to easily understand a cause of a production defect that may be generated in the substrate production line 1, and to extract a cause of the defect of the substrate production line 1 without omission. Meanwhile, the production information is made in the form of a table for each of the references REF1 to REF3 and is stored in the memory of the host computer. Further, various kinds of information, which are related to production, can be used as production information other than the above-mentioned production information.

Figure 4:
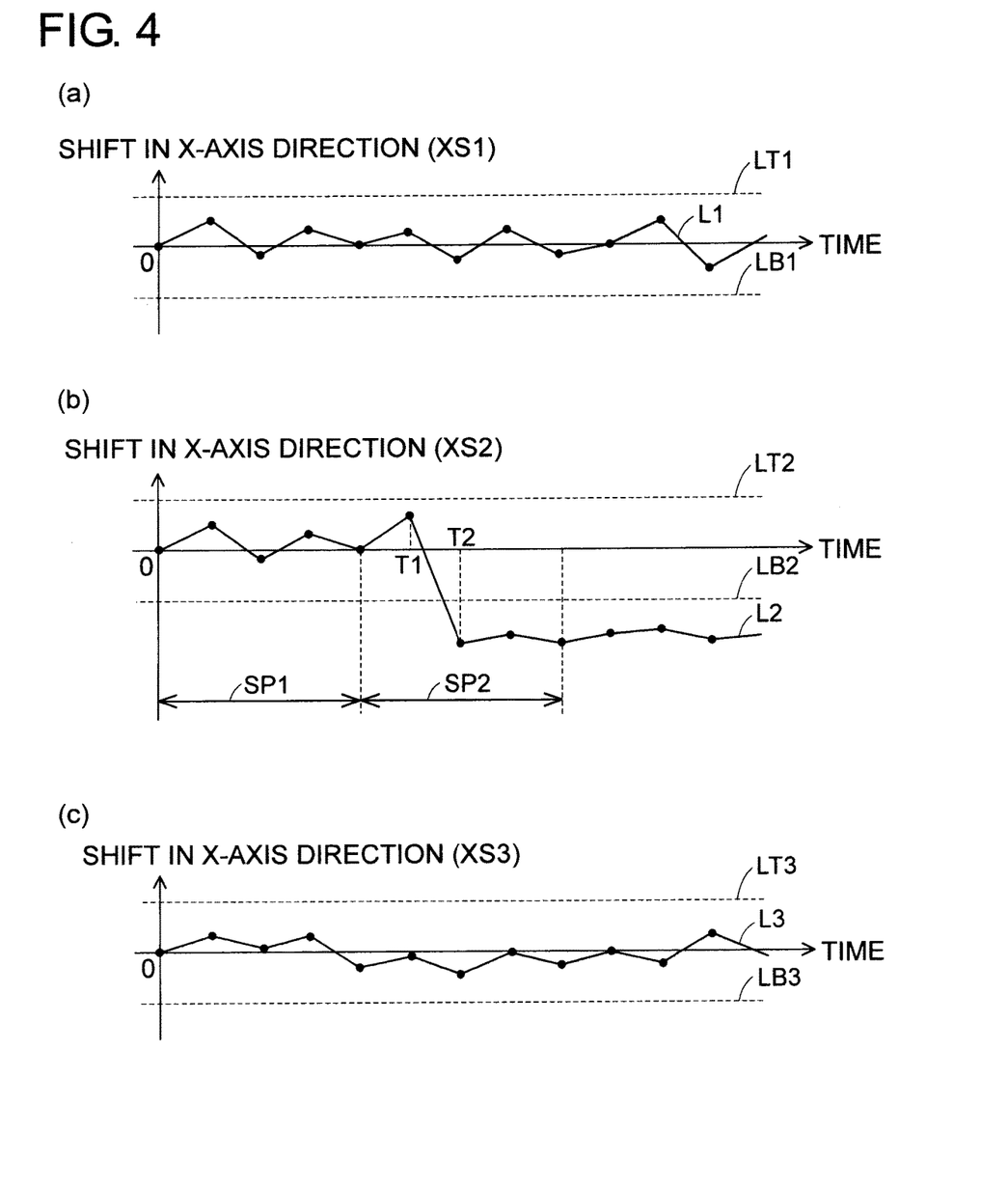
FIG. 4 shows waveform diagrams showing the changes with time of shifts of components in an X-axis direction, in which (a) shows a reference REF1, (b) shows a reference REF2, and (c) shows a reference REF3.

Next, the defect indication detection unit 61 detects an indication of a production defect from the change with time of measurement information at the references REF1 to REF3. FIG. 4 shows waveform diagrams showing the changes with time of shifts of the components P1 to P3 in the X-axis direction, FIG. 4(a) shows the reference REF1, FIG. 4(b) shows the reference REF2, and FIG. 4(c) shows the reference REF3. FIG. 4 shows diagrams in which a shift XS1 of the component P1 in the X-axis direction, when the component P1 is mounted on the substrates PB1 to PB3, is plotted in order of mounting. The same also applies to a shift XS2 of the component P2 in the X-axis direction and a shift XS3 of the component P3 in the X-axis direction, and the same also applies to other measurement information.

In FIG. 4, the change with time of the shift XS1 of the component P1 at the reference REF1 in the X-axis direction is shown by a curve L1. Further, a standard upper limit of the shift XS1 in the X-axis direction is shown by a straight line LT1, and a standard lower limit of the shift XS1 in the X-axis direction is shown by a straight line LB1. The same also applies to the references REF2 and REF3.

As shown in FIG. 4(a), the shift XS1 (curve L1) of the component P1 at the reference REF1 in the X-axis direction is in a standard range that is represented by the straight lines LT1 and LB1. Accordingly, an indication of a production defect does not appear at the reference REF1. The same also applies to the reference REF3 (FIG. 4(c)). Meanwhile, as shown in FIG. 4(b), the shift XS2 (curve L2) of the component P2 at the reference REF2 in the X-axis direction becomes smaller than a standard lower limit, which is shown by a straight line LB2, to time T2 from time T1. This state is maintained even at the time T2 or later. That is, an indication of a production defect appears at the reference REF2 at the time T2 or later.

Figure 5:
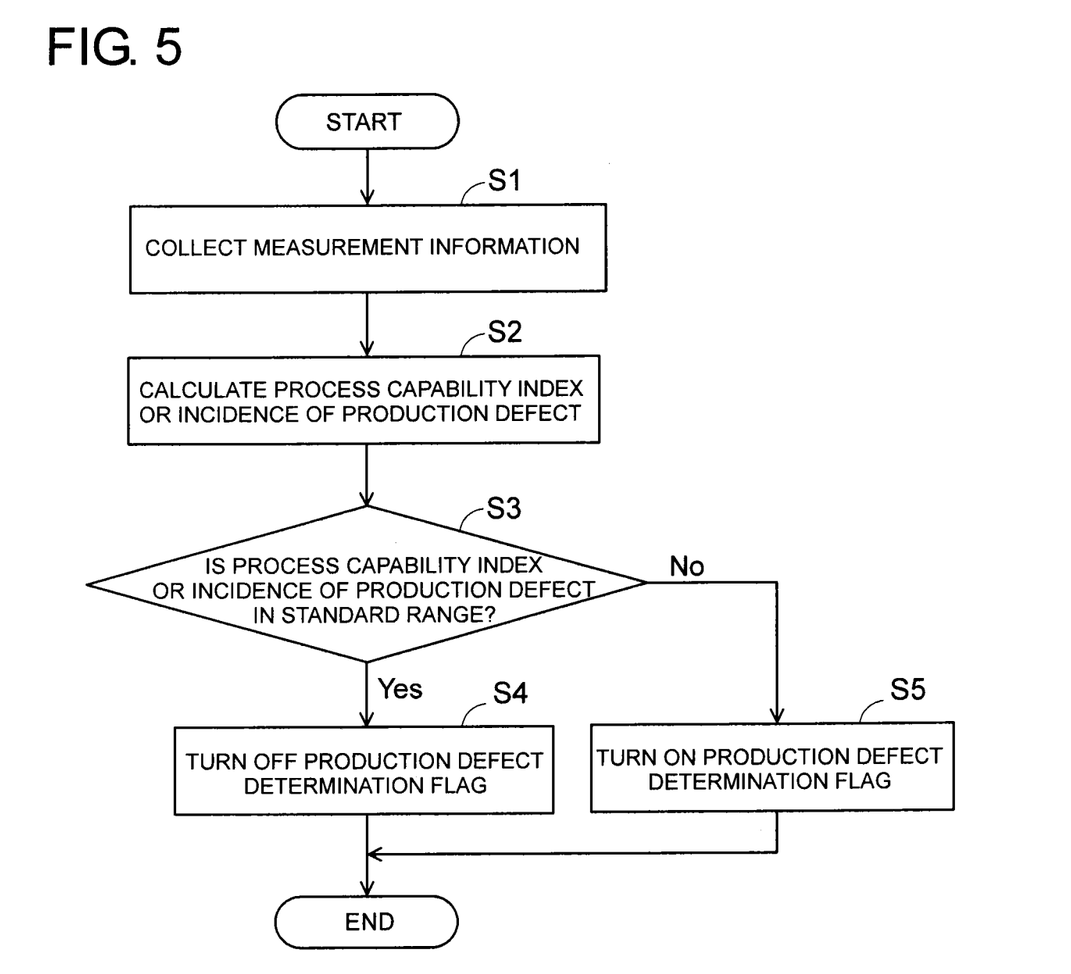
FIG. 5 is a flowchart illustrating an example of a procedure for detecting an indication of a production defect.

FIG. 5 is a flowchart illustrating an example of a procedure for detecting an indication of a production defect. First, in Step S1, measurement information is collected for each of the references REF1 to REF3. Next, in Step S2, a process capability index or an incidence of a production defect is calculated from the measurement information. Further, in Step S3, it is determined whether or not a process capability index or an incidence of a production defect is in the standard range.

If a process capability index or an incidence of a production defect is in the standard range (YES), the procedure proceeds to Step S4. In Step S4, a production defect determination flag is turned off and this routine ends temporarily. Meanwhile, if a process capability index or an incidence of a production defect is not in the standard range in Step S3 (NO), the procedure proceeds to Step S5. In Step S5, a production defect determination flag is turned on and this routine ends temporarily.

A process capability index is an index that is obtained by digitizing a capacity for producing products (the substrates PB1 to PB3) that satisfy quality standards. Specifically, the defect indication detection unit 61 calculates a process capability index by dividing a required standard width by $6\sigma$ (six times $\sigma$). However, $\sigma$ is a standard deviation, and the standard width is calculated by subtracting the standard lower limit from the standard upper limit. The standard upper limit and the standard lower limit are predetermined in consideration of characteristics of production information, and are stored in the memory of the host computer.

The defect indication detection unit 61 calculates a process capability index whenever a predetermined time elapses. Further, when a calculated value of a process capability index is in a predetermined range, the defect indication detection unit 61 determines that the process capability index is in the standard range. Meanwhile, when the calculated value of the process capability index is not in the predetermined range, the defect indication detection unit 61 determines that the process capability index is not in the standard range.

For example, as shown in FIG. 4(b), the defect indication detection unit 61 calculates a process capability index CP1 on the basis of five pieces of measurement information of a first sampling time SP1 (the shift XS2 of the component P2 in the X-axis direction). Next, the defect indication detection unit 61 calculates a process capability index CP2 on the basis of five pieces of measurement information of a second sampling time SP2 (the shift XS2 of the component P2 in the X-axis direction). Since a deviation of the five pieces of measurement information of the second sampling time SP2 is larger than a deviation of the five pieces of measurement information of the first sampling time SP1, the process capability index CP2 is smaller than the process capability index CP1. For example, since the process capability index CP2 is not in a predetermined range (for example, a range of 1.33 to 1.67) when the process capability index CP2 is 1.2, the defect indication detection unit 61 determines that the process capability index is not in the standard range. Meanwhile, the process capability index CP1 is set in the predetermined range (for example, the range of 1.33 to 1.67).

Further, only one of the standard upper limit and the standard lower limit can be used for the process capability index. In this case, the defect indication detection unit 61 calculates the process capability index by dividing a required standard width by $3\sigma$ (three times $\sigma$). When only the standard upper limit is used, a standard width is calculated by subtracting an average value of measurement information from the standard upper limit. When only the standard lower limit is used, a standard width is calculated by subtracting the standard lower limit from an average value of measurement information.

An incidence of a production defect can be used when a production state is represented by a discrete value, such as a normal state in which a production state is normal or an abnormal state in which a production state is abnormal. Specifically, an incidence of a production defect is a ratio of the number of times of production, of which the state is abnormal, to the number of times of production in a predetermined period of time. A case in which an incidence of a production defect is calculated in regard to whether or not the component P1 is present at the reference REF1 will be described as an example.

For example, it is assumed that a state in which the component P1 is not mounted (abnormal state) is generated one time when the component P1 is mounted ten times. In this case, an incidence of a production defect is 10%. Next, it is assumed that a state in which the component P1 is not mounted (abnormal state) is generated three times when the component P1 is mounted ten times. In this case, an incidence of a production defect is 30%.

The defect indication detection unit 61 calculates an incidence of a production defect whenever a predetermined time elapses. Further, when an incidence of a production defect is lower than a predetermined value, the defect indication detection unit 61 determines that an incidence of a production defect is in the standard range. Meanwhile, when an incidence of a production defect is equal to or higher than a predetermined value, the defect indication detection unit 61 determines that an incidence of a production defect is not in the standard range. In the above-mentioned example, an incidence of a production defect is higher than a predetermined value (for example, 20%) when an incidence of a production defect is 30%. Accordingly, the defect indication detection unit 61 determines that an incidence of a production defect is not in the standard range. Meanwhile, when an incidence of a production defect is 10%, an incidence of a production defect is lower than a predetermined value (for example, 20%). Accordingly, the defect indication detection unit 61 determines that an incidence of a production defect is in the standard range.

In this embodiment, the defect indication detection unit 61 detects an indication of a production defect on the basis of the process capability index or the incidence of a production defect that is calculated from the measurement information. For this reason, since it is easy to quantify production quality, the defect indication detection unit 61 can easily determine whether or not production quality is in the standard range. Further, the defect indication detection unit 61 can quantitatively detect an indication of a production defect.

Furthermore, the defect indication detection unit 61 collects measurement information that is measured by the inspection apparatus 5 for each of the references REF1 to REF3 identifying mounting positions on the substrates PB1 to PB3 serving as products, and detects an indication of a production defect from the change with time of the measurement information at the references REF1 to REF3. For this reason, since it is easy to identify the reference REF2 related to a production defect, it is easy to extract measurement information at the identified reference REF2 and production information that is related to the identified reference REF2.

(Defect Cause Identification Unit 62)

The defect cause identification unit 62 performs stratified analysis on the basis of production information that is related to the reference REF2 when the defect indication detection unit 61 detects an indication of a production defect, and identifies a cause of a production defect from a result of the analysis. When the defect indication detection unit 61 detects an indication of a production defect at the reference REF2, the defect indication detection unit 61 turns on a production defect determination flag. Since an indication of a production defect does not appear at the references REF1 and REF3, the defect indication detection unit 61 turns off a production defect determination flag. The defect cause identification unit 62 performs stratified analysis on the basis of production information that is related to the reference REF2 at which a production defect determination flag is turned on.

Production information generally includes plural pieces of information for a plurality of items (which are kinds, and are, for example, the component mounting machine 3, the component mounting head, the suction nozzle, the feeder, and the like) (for example, four component mounting machines M1 to M4 for the component mounting machine 3). Meanwhile, when the component P2 is mounted at the reference REF2 on the substrate PB1, a component mounting machine M1 is used as the component mounting machine 3 and a component mounting head H1 is used as the component mounting head as shown in FIG. 3. Further, a suction nozzle N2 is used as the suction nozzle and a feeder F2 is used as the feeder.

As described above, production information related to one reference REF2 is limited to one piece of information for one item (kind). For this reason, the defect cause identification unit 62 can limit an object, which is to be analyzed, to one piece of production information (in this case, the component mounting machine M1, the component mounting head H1, the suction nozzle N2, and the feeder F2) for each item (kind) of the production information related to the reference REF2 when an indication of a production defect is detected. Accordingly, since the production line monitoring device 6 can reduce the amount of analysis data and the amount of computation in comparison with a case in which analysis is performed for all production information, the production line monitoring device 6 easily performs real-time processing.

Figure 6:
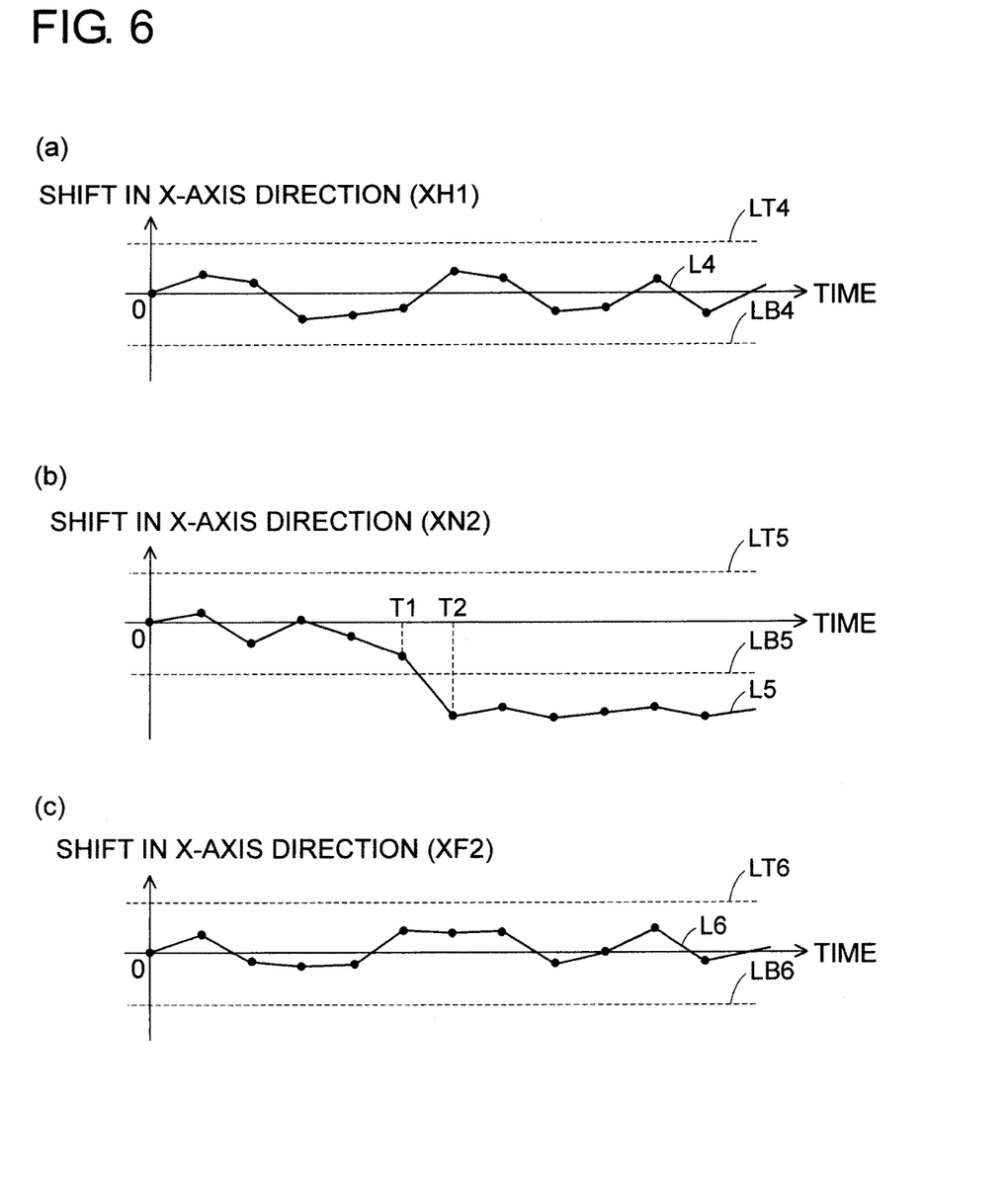
FIG. 6 shows waveform diagrams showing the change with time of a shift at the reference REF2 in the X-axis direction, in which (a) shows a component mounting head H1, (b) shows a suction nozzle N2, and (c) shows a feeder F2.

FIG. 6 shows waveform diagrams showing the change with time of a shift at the reference REF2 in the X-axis direction, FIG. 6(a) shows the component mounting head H1, FIG. 6(b) shows the suction nozzle N2, and FIG. 6(c) shows the feeder F2. FIG. 6 shows diagrams in which the shift XS2 of the component P2 in the X-axis direction, when the component P2 is mounted on the substrates PB1 to PB3, is plotted in order of mounting for each production information related to the reference REF2.

A shift XH1 of the component P2 in the X-axis direction (hereinafter, referred to as a shift XH1 of the component mounting head H1 in the X-axis direction), when the component P2 is mounted on the substrates PB1 and PB3 by the component mounting head H1, is shown in FIG. 6 by a curve L4. Further, a standard upper limit of the shift XH1 in the X-axis direction is shown by a straight line LT4, and a standard lower limit of the shift XH1 in the X-axis direction is shown by a straight line LB4. The same also applies to the suction nozzle N2 and the feeder F2.

As shown in FIG. 6(a), the shift XH1 (curve L4) of the component mounting head H1 in the X-axis direction is in a standard range that is represented by the straight lines LT4 and LB4. Accordingly, it is considered that the component mounting head H1 is not a cause of a production defect. The same also applies to the feeder F2 (FIG. 6(c)). Meanwhile, as shown in FIG. 6(b), a shift XN2 of the suction nozzle N2 in the X-axis direction becomes smaller than a standard lower limit, which is shown by a straight line LB5, to time T2 from time T1. This state is maintained even at the time T2 or later. That is, it is considered that the suction nozzle N2 is a cause of a production defect.

As described above, the defect cause identification unit 62 determines that an indication of a production defect at the reference REF2 is caused by the suction nozzle N2. Meanwhile, since a specific procedure for identifying a cause of a production defect is the same as the procedure for detecting an indication of a production defect, a cause of a production defect can be identified on the basis of a process capability index or an incidence of a production defect.

In this embodiment, the defect cause identification unit 62 performs stratified analysis on the basis of production information that is related to the reference REF2 when the defect indication detection unit 61 detects an indication of a production defect; and identifies a cause of a production defect from a result of the analysis. For this reason, the defect cause identification unit 62 can identify a cause of a production defect with a high accuracy in comparison with a case in which the defect cause identification unit 62 analyzes a cause of a defect on the basis of the probability of occurrence calculated in advance or designates and limits an object to be analyzed in advance.

(Defect Countermeasure Determination Unit 63)

The defect countermeasure determination unit 63 determines the contents of countermeasures against a production defect. The contents of countermeasures and the order of priority of countermeasures are stored in the memory of the host computer in advance. The defect countermeasure determination unit 63 acquires the contents of countermeasures against a cause of a production defect, which is identified by the defect cause identification unit 62, with reference to the memory of the host computer. When there are a plurality of causes of a production defect, the defect countermeasure determination unit 63 also acquires the order of priority of countermeasures together.

Next, the defect countermeasure determination unit 63 determines whether or not an operator needs to perform countermeasures against a production defect. A case in which an operator needs to perform countermeasures against a production defect is referred to as an operator countermeasure, and a case in which an operator does not need to perform countermeasures against a production defect is referred to as an automatic countermeasure. In the case of the operator countermeasure, the defect countermeasure determination unit 63 sends a countermeasure signal to the defect countermeasure instruction unit 64.

In the case of the automatic countermeasure, the defect countermeasure determination unit 63 sends a countermeasure signal to the solder printer 2, the component mounting machine 3, or the reflow machine 4. When receiving a countermeasure signal, the solder printer 2, the component mounting machine 3, or the reflow machine 4 performs countermeasures against a production defect on the basis of the received contents of countermeasures. For example, when the defect cause identification unit 62 determines that the suction nozzle N2 is a cause of a production defect, the defect countermeasure determination unit 63 instructs the component mounting machine 3 to exchange the suction nozzle N2. When the component mounting machine 3 receives an instruction for exchanging the suction nozzle N2 from the defect countermeasure determination unit 63, the component mounting machine 3 exchanges the suction nozzle N2 with a normal suction nozzle.

(Defect Countermeasure Instruction Unit 64)

When receiving a countermeasure signal from the defect countermeasure determination unit 63, the defect countermeasure instruction unit 64 displays the contents of countermeasures and the order of priority of countermeasures in a monitor 7. An operator performs countermeasures against a production defect in accordance with the contents of countermeasures and the order of priority of countermeasures that are displayed in the monitor 7. For example, it is assumed that the component mounting head H1 (having the first order of priority) and the feeder F2 (having the second order of priority) are causes of a production defect. The defect countermeasure instruction unit 64 allows the monitor 7 to display that the component mounting head H1 and the feeder F2 are causes of a production defect and the component mounting head H1 and the feeder F2 need to be exchanged with normal ones in this order, and calls for an operator's attention. An operator exchanges the component mounting head H1 and the feeder F2 with a normal component mounting head H1 and a normal feeder F2 in this order in accordance with the contents displayed in the monitor 7.

Since an indication of a production defect of the substrate production line 1 can be detected in this embodiment, it is possible to perform countermeasures against a production defect before a production defect is actually generated in the substrate production line 1. Therefore, it is possible to improve the rate of operation of the substrate production line 1.

<Others>

The disclosure is not limited to only the embodiment that has been described above and shown in the drawings, and can be appropriately modified without departing from the scope of the invention. For example, the disclosure is not limited to a case in which an indication of a production defect of a production line is detected, and can also be applied to a case in which a production defect of a production line is actually detected (for example, a defective component and the like).

REFERENCE NUMBER LIST

1: substrate production line
2: solder printer
3: component mounting machine
4: reflow machine
5: inspection apparatus
6: production line monitoring device
61: defect indication detection unit
62: defect cause identification unit

The invention claimed is:

1. A production line monitoring device comprising:
a defect indication detection unit that detects an indication of a production defect of a production line; and
a defect cause identification unit that identifies a cause of the production defect,
wherein the defect indication detection unit collects measurement information that is measured by an inspection apparatus for each reference that identifies a position on products, and detects an indication of the production defect from a change with time of the measurement information at the references, the defect indication detection unit detects the indication of the production defect when a first process capability index of one of the references calculated from the measurement information or an incidence of the production defect of the one of the references calculated from the measurement information is not within a first predetermined standard range, and
the defect cause identification unit performs stratified analysis based on production information that is related to the one of the references when the defect indication detection unit detects the indication of the production defect, and identifies a cause of the production defect when a second process capability index calculated from a result of the stratified analysis of the production information related to the one of the references or an incidence of the production information of the one of the references is not within a second predetermined standard range.

2. The production line monitoring device according to claim 1,
wherein the production information is at least one of information about facilities of the production line, information about a raw material to be supplied to the production line, information about an operator operating the production line, and information about a producing procedure of the production line.

3. The production line monitoring device according to claim 1,
wherein the production line is a substrate production line including a solder printer that performs printing on a substrate with solder paste, a component mounting machine that mounts a component on the substrate, and a reflow machine that solders the component mounted on the substrate, and
the inspection apparatus is provided in the substrate production line.

* * * * *